United States Patent [19]

Cabanel et al.

[11] Patent Number: 5,378,683
[45] Date of Patent: Jan. 3, 1995

[54] JOSEPHSON JUNCTION STRUCTURE

[75] Inventors: Régis Cabanel, Paris; Guy Garry, Rueil Malmaison; Alain Schuhl, Clamart; Bruno Ghyselen, Meulun, all of France

[73] Assignee: Thomson-CSF, Puteaux, France

[21] Appl. No.: 871,537

[22] Filed: Apr. 21, 1992

[30] Foreign Application Priority Data

Apr. 23, 1991 [FR] France .................. 91 04996

[51] Int. Cl.⁶ .............. H01L 39/12; H01L 39/22; H01B 12/00
[52] U.S. Cl. .................. 505/190; 505/238; 505/329; 505/700; 505/702; 505/780; 505/779; 505/874; 257/31; 257/32; 257/33
[58] Field of Search .............. 257/31, 32, 33, 34, 257/35, 36, 37, 662, 663; 505/1, 702, 780, 779, 874, 190, 191, 237, 238, 329, 330

[56] References Cited

U.S. PATENT DOCUMENTS

| 4,952,526 | 8/1990 | Pribat et al. | 437/89 |
| 5,053,833 | 10/1991 | Pribat et al. | 257/30 |
| 5,090,932 | 2/1992 | Dieumegard et al. | 445/24 |

FOREIGN PATENT DOCUMENTS 0427640 5/1991 European Pat. Off. .
1039084 2/1989 Japan .

OTHER PUBLICATIONS

Applied Physics Letters vol. 56, No. 15, Apr. 9, 1990, New York U.S.; pp. 1487-1489; H. Akoh, et al.: "Anisotropic Josephson Junction of Y-BA-CU-O/AU/NB Film Sandwiches".

Primary Examiner—William D. Larkins
Assistant Examiner—Alice W. Tang
Attorney, Agent, or Firm—Oblon, Spivak, McClelland, Maier & Neustadt

[57] ABSTRACT

The disclosure relates to a Josephson junction formed by a non-superconducting barrier between two superconducting films of the (R) BaCuO (R=rare earth) group. In order to take advantage of the greater coherence length of superconductors along the CuO planes, i.e. perpendicularly to the long axis "c" of the crystal unit cell, the superconducting film is oriented so that the axis "c" is parallel to the plane of the junction. The device can be applied to Josephson junctions and to SQUIDs.

5 Claims, 1 Drawing Sheet

JOSEPHSON JUNCTION STRUCTURE

BACKGROUND OF THE INVENTION

Field of the Invention

The present invention relates to the structure of a Josephson junction, comprising a non-superconducting structure sandwiched between two superconducting layers. The structure of the invention makes it easier to set up a Josephson junction in making it possible to derive advantage from greater coherence lengths (the coherence length being the length over which the Josephson effect is exerted) with the so-called high critical temperature superconducting (HCTS) materials.

Discussion of the Background

The Josephson effect is an effect related to superconductors, according to which a superconductive current or supercurrent can cross a barrier between two superconductors. If the barrier is insulating or semiconducting, its thickness should be in the range of the coherence length. If the barrier is a normal metal, its maximum thickness depends on the coherent length in the superconductor and on the mean free path of electrons in the metal.

A Josephson junction is constituted by a barrier of insulating material between two layers of superconductors: if the layer of normally conductive material is fine enough, and has a thickness at most equal to the sum of the coherence lengths of the two layers of superconducting materials, then a supercurrent flows through this layer of insulator material.

In fact, it is very difficult to make a Josephson junction for, depending on the nature of the non-superconducting material (metal, semiconductor or insulator,) the barrier layer has a thickness of 0.3 to 0.5 nm. It is very difficult to obtain a barrier such as this having a thickness that is even, homogeneous and without short-circuits.

When the superconductors are copper, barium and rare earth oxides, of the group known as YBaCuO, the invention provides an improvement to the making of a Josephson junction by proposing the use of the greatest coherent length of high critical temperature superconductors parallel to the saturated CuO planes, in the YBaCuO crystal. Consequently, if at least one of the two layers of superconductors, which are in contact with a barrier to form a Josephson junction, has its saturated CuO planes perpendicular to the barrier, the coherence length in the barrier is greater. This means that the barrier can be made with a greater thickness (of 1.5 to 2 nm), hence more easily. The invention can be applied to any other group of anisotropic superconductors.

The invention therefore lies in a Josephson junction structure, formed by a non-superconducting barrier layer located between two superconducting layers such that, for at least one of these two said layers, the crystallographic planes of CuO are perpendicular to the barrier layer. It may also be taken to be the case that the longest axis of the cell structure, in the YBaCuO crystal unit cell, is perpendicular to the CuO planes and that, in a Josephson junction according to the invention, the superconducting layers in contact with the barrier are deposited so that the longest axis of their crystal unit cell is parallel to the barrier.

SUMMARY OF THE INVENTION

More precisely, the invention consists of a Josephson junction structure, formed between a non-superconducting barrier and at least one film made of a high-temperature superconducting material of the (R) $Ba_2Cu_3O_7$ group where R is a rare earth, said junction being one wherein, in order to obtain a greater coherent length of the supercurrent in the barrier, the film of superconducting material is oriented so that the long axis "c" of its crystal unit cell, which is perpendicular to the CuO planes, is parallel to the plane of the junction with the barrier.

BRIEF DESCRIPTION OF THE DRAWINGS

The invention will be understood more clearly from the following more detailed example of two exemplary embodiments, in conjunction with the appended figures of which.

MORE DETAILED DESCRIPTION

Figure 1:
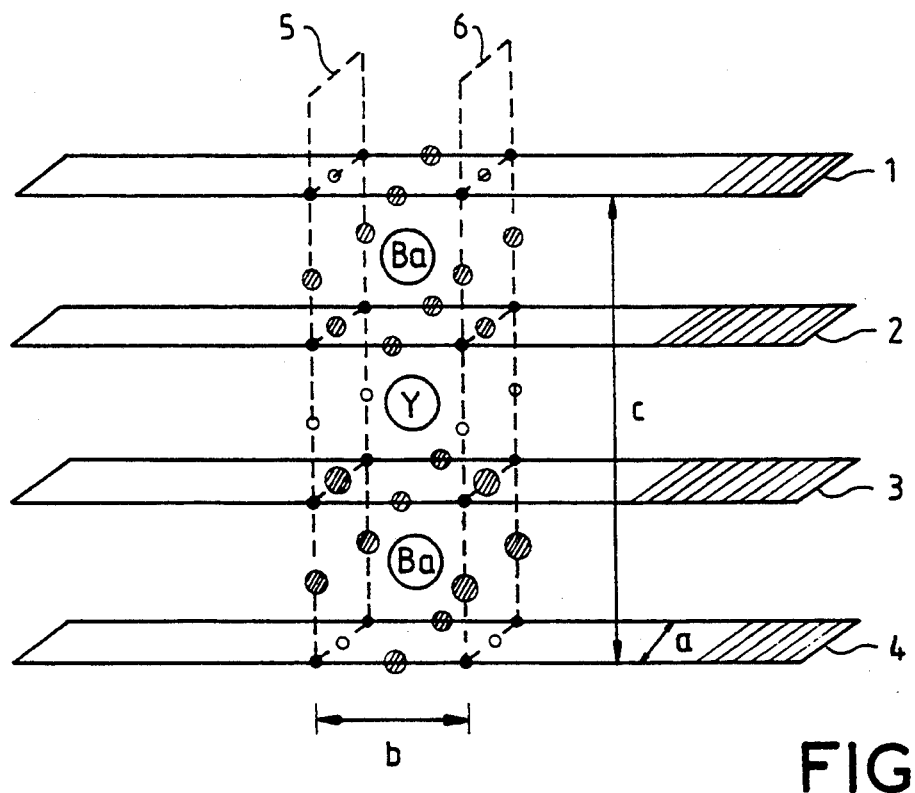
FIG. 1 shows a crystallographic diagram of a YBaCuO type superconductor molecule.

FIG. 1 shows the spatial distribution of the atoms in a crystal of one of these high critical temperature superconducting materials, which is designated for convenience's sake as YBaCuO although the yttrium atom Y may be more generally replaced by a rare earth atom such as dysprosium. These materials crystallize in the orthorhombic system. In the elementary crystal of FIG. 1, it is easy to identify the rare earth atom Y and the two barium atoms Ba. The copper atoms are represented by small black circles, the oxygen atoms by medium-sized hatched circles and the vacancies by small blank circles. The number of vacancies in the crystal depends on the degree of oxidation, and the CuO planes are not all equally oxidated. Thus, if the four CuO planes referenced 1 to 4 are considered, the two central planes 2 and 3 are saturated with oxygen (with four Cu atoms and four O atoms each) while the two external planes 1 and 4 are not saturated with oxygen (with four Cu atoms, two O atoms and two vacancies each). It is a known fact that the conductibility is greater in the saturated planes 2 and 3 than in the non-saturated planes 1 and 4 or in the orthogonal planes referenced 5 and 6. It is also known that the coherent length, for a given superconducting/non-superconducting pair, is greater in parallel to these saturated CuO planes. Correlatively, the coherence length, for the same pair, is smaller in parallel to the planes referenced 5 and 6.

This means that a non-superconducting barrier, the thickness of which is measured in parallel to the saturated CuO planes 2 and 3, may be thicker (hence easier to make) than a barrier with a thickness that would be parallel to the planes 5 and 6.

More generally, an orthorhombic crystal of YBaCuO has:
  a first short axis "a" (a=3.82 Å)
  a second short axis "b" (b=3.89 Å)
  a long axis "c" (c=11.69 Å) which is parallel to the alignment Ba-Y-Ba and perpendicular to the saturated CuO planes 2 and 3.

The coherence length in the barrier is greater if the barrier is parallel to the axis "c" of the YBaCuO crystal unit cell.

Figure 2:
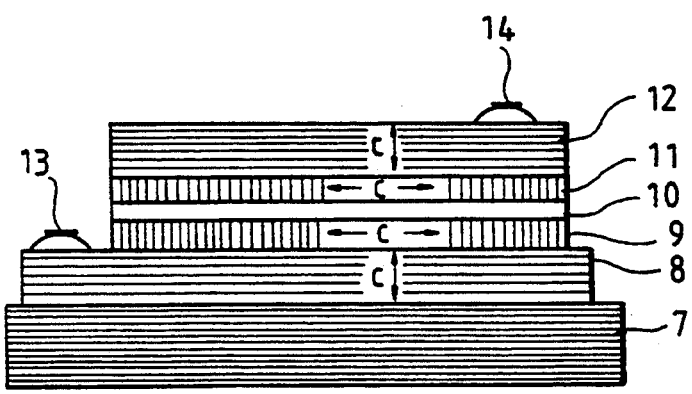
FIG. 2 shows a section of a Josephson junction according to the invention.

FIG. 2 shows a first Josephson junction structure according to the invention. It comprises:

a substrate 7, a layer 8 of superconducting material, which is a first layer providing access for the current to the Josephson junction;

the Josephson junction formed by a barrier 10 in contact with at least one of the two superconducting layers 9 and 11;

a layer 12 of superconducting material, which is a second layer providing access for the current to the Josephson junction.

For all these layers, the lines that hatch the layers represent the planes parallel to the saturated CuO planes, i.e. again the planes perpendicular to the long axes "c" of the crystal unit cells.

The substrate 7 may be made of strontium titanate SrTiO$_3$ for example but, in this first structure called a CA structure, the section is parallel to the crystallographic planes (001) symbolized by horizontal lines on the substrate 7.

The access layers 8 and 12, made of superconductor of the (R) Ba$_2$Cu$_3$O$_7$ (R=rare earth) group which has a lattice parameter well matched with that of SrTiO$_3$, have their saturated CuO planes parallel to the barrier 10, namely their "c" axis perpendicular to the barrier.

The two superconducting films 9 and 11 which are made of the same type of (R) Ba$_2$Cu$_3$O$_7$ material have, on the contrary, their saturated CuO planes perpendicular to the barrier 10, so that the coherence length in the barrier is greater than for a different orientation. The "c" axis of their crystal unit cell is thus parallel to the barrier.

The barrier 10 is constituted by a film with a thickness in the range of the coherence length, namely at the most a length in the range of 1.5 to 2 mm. It is made of a material that is not a superconductor. In barriers of an SNS (namely superconductor-normal-superconductor) type, it is a "normal" metal such as gold or silver. In SIS (superconductor-insulator-superconductor) type barriers, it is an insulator or rare earth oxide such as BaF$_3$, MgO, ZrO$_3$, SiTiO$_3$, AlGaO$_3$, LaGaO$_3$ etc. In any case, the barrier and the film or films that form the Josephson junction should have matching lattice parameters.

The access in current to the Josephson junction is obtained by two pads 13 and 14 on the access layers 8 and 12. The interconnection is preferably made of superconducting materials.

Figure 3:
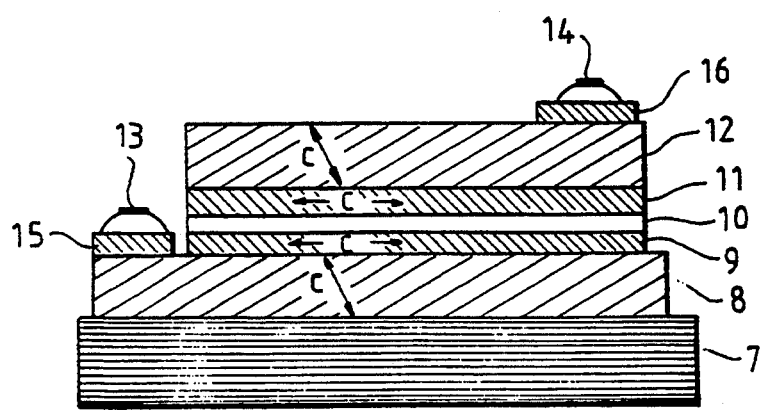
FIG. 3 shows a section of a Josephson junction in a variant of the invention.

A slightly different structure is shown in FIG. 3. The number, nature and stacking of the layers therein are the same as in FIG. 2, but the substrate therein is disoriented by an angle α which has been exaggerated with the sole purpose of highlighting the fact that the section of the substrate is no longer parallel to the plane of the crystal lattice.

If the matching of lattice parameters between the substrate 7 and the access layer 8 is sufficiently good (this is the case between SrTiO$_3$ and (R) Ba$_2$Cu$_3$O$_7$), the layer 8 of superconductor is adapted to the disorientation of the substrate so as to align its long axis "c" with that of the substrate. Thus, the saturated CuO planes in the layer 8 form an angle α with the surface of the substrate 7 but also with the surface of the superconducting film 9; the structure is said to be a disoriented CA structure.

The value of this structure is that the surface of the film 9 in contact with the layer 8 intercepts several copper oxide planes by their ends. This increases the critical current at the junction between these two layers 8 and 9. For it has been said, with reference to FIG. 1, that the conductibility is greater along the copper oxide planes and that the resistivity is greater along the planes 5 and 6 parallel to the long axis "c" of the crystal unit cell. It follows therefrom that, if the CuO planes of the layer 8 intercept the CuO planes of the neighboring layer, the critical current is higher since it no longer needs to be propagated along the planes of higher resistivity to go from one layer to the other.

The disoriented CA structure is (leaving aside the substrate) symmetrical with respect to the barrier 10.

The pads 13 and 14 may be made directly on the access layers 8 and 12, as in the CA structure. However, since said layers are (or at least one of said two layers is) disoriented by an angle α, it is advantageous to provide the pads 13 and 14 with the benefit of the same advantages as the films that form the Josephson junction. Consequently, in the case of the disoriented CA structure, the pads 13 and 14 are preferably deposited on fragments of films 15 and 16 of superconducting material having the same orientation of the CuO planes as the films 9 and 11 of the junction, thus, their CuO planes intercept the CuO planes of the layer 8, and the critical current at the pads is higher.

For high critical temperature superconducting materials of the (R) Ba$_2$Cu$_3$O$_7$ group, the epitaxial growth of films with a crystalline orientation "a" on "c", or vice versa, can be done because of the proper matching between the parameter "c" and three times the parameter "a" ($3a$) of a crystal unit cell.

The structures of Josephson junctions according to the invention can be done by several deposition methods, including the techniques of laser ablation and molecular beam epitaxy. In laser ablation, the main parameters that influence the crystal orientation of the film are the temperature of the substrate and the oxygen pressure. This is also the case for other deposition techniques, for this orientation is related to the variation of the anisotropy of the kinetics of growth of the faces 100 (or 010) or 001, and of the crystal parameters as a function of these two parameters. The carrying out of epitaxial growth operations such as these on site guarantees an abrupt interface and thereby ensures efficient transfer of the Cooper pairs of electrons through a junction.

The invention has been described, by way of an example, with reference to a Josephson junction having two films 9 and 11 on either side of the barrier 10. It can also be applied to superconductor-normal metal type structures or superconductor-insulator-normal metal type structures, but a symmetrical structure is preferable in order to benefit from the supercurrent throughout the chain.

The invention can be applied to the making of Josephson junctions for fast electronics, especially digital electronics, as well as to the making of instruments for the measurement of the magnetic field, notably the instrument known as the SQUID (superconducting Quantum Interface Device) in a sandwich configuration.

What is claimed as new and is desired to be secured by Letters Patent of the United States is:

1. A Josephson junction structure, formed between a non-superconducting barrier and at least one film made of a first high-temperature superconducting material of a (R) BaCuO group, in which R is a rare earth element, said film being supported by at least one electrical access layer made of a second high-temperature superconducting material, of a same (R) BaCuO group as said at least one film, wherein a longest axis "c" of a film crystal unit cell of said at least one film is perpendicular to a longest axis "c" of an access layer crystal unit cell of said at least one access layer, each of said axes "c" being perpendicular to CuO planes of the respective first and second superconducting material.

2. A structure according to claim 1, wherein in order to obtain a greater coherence length of supercurrent in the barrier, said at least one film of high-temperature superconducting material is oriented so that said longest axis "c" of its crystal unit cell is parallel to a plane of the junction with the non-superconducting barrier, and the access layer is oriented so that the longest axis "c" of its crystal unit cell is perpendicular to the plane of the junction.

3. A structure according to claim 1, wherein, in order to increase a critical current at the junction between said at least one film and said at least one electrical access layer, said at least one electrical access layer being oriented so that the longest axis "c" of its crystal cell unit is inclined perpendicular to the junction.

4. A structure according to claim 1, wherein at least one electrical contact pad is made on at least one of said at least one access layer by means of a fragment of film having a crystal orientation the same as a crystal orientation of said at least one film.

5. A structure according to claim 1, wherein the non-superconducting barrier is made of a material which is one of an insulating type, normally conducting metal type and semiconducting type.

* * * * *